United States Patent [19]

Martin et al.

[11] Patent Number: 5,829,667
[45] Date of Patent: Nov. 3, 1998

[54] METHOD FOR STRENGTHENING A SOLDER JOINT WHEN ATTACHING INTEGRATED CIRCUITS TO PRINTED CIRCUIT BOARDS

[75] Inventors: Frank John Martin, North Kelvinside; Brian Robertson, Gourock, both of United Kingdom

[73] Assignee: International Business Machines Corporation, Armonk, N.Y.

[21] Appl. No.: 715,950

[22] Filed: Sep. 19, 1996

[30] Foreign Application Priority Data

Dec. 23, 1995 [GB] United Kingdom .................. 9526504

[51] Int. Cl.$^6$ ................................................ B23K 31/02
[52] U.S. Cl. ...................... 228/180.21; 228/231; 148/528
[58] Field of Search ............................. 228/231, 180.21; 148/528

[56] References Cited

U.S. PATENT DOCUMENTS

| 3,411,961 | 11/1968 | Harvey | 148/528 |
| 4,611,746 | 9/1986 | Levine et al. | 228/231 |
| 5,188,982 | 2/1993 | Huang | 228/231 |
| 5,236,118 | 8/1993 | Bower et al. | 228/231 |

OTHER PUBLICATIONS

Kwang–Lung Lin et al., Wetting Behavior Between Solder and Electroless Nickel Deposits, Materials Chemistry and Physics, V. 38, 1994, pp. 33–41.

W. Engelmaier, et al., Component Lead and Attachment, Circuits Assembly, Jun. 1995, pp. 72–75.

*Primary Examiner*—Patrick Ryan
*Assistant Examiner*—Jeffrey T. Knapp
*Attorney, Agent, or Firm*—H. Daniel Schnurmann

[57] ABSTRACT

A method for increasing the strength of a solder joint between a nickel-iron lead frame of an electronic circuit module and a copper pad of a printed circuit board on which the module is mounted includes baking the joint for at least one hour at a temperature in the range 373K to 456K. The baking step is found to significantly increase the strength of the joint.

3 Claims, 2 Drawing Sheets

METHOD FOR STRENGTHENING A SOLDER JOINT WHEN ATTACHING INTEGRATED CIRCUITS TO PRINTED CIRCUIT BOARDS

FIELD OF THE INVENTION

The present invention relates to improvements in strength of solder joints between the lead frame of an electronic component and the corresponding pads of a printed circuit board (PCB).

BACKGROUND OF THE INVENTION

Solder joints for attaching electronic components such as integrated circuit modules to PCBs are developing from conventional Pin-Through-Hole and Surface-Mount Technology (SMT) configurations to a multiplicity of miniaturized formats. Such miniaturized formats can have a much finer lead pitch than the aforementioned conventional configurations, they can have different module geometries, and they can include both eutectic and non-eutectic alloys in the same joint.

One such miniaturized form widely used in the electronics industry is generally referred to as Quad Flat Pack (QFP). QFP modules typically have a 16 mil lead pitch and leads formed from a nickel-iron base metal coated with Tin-Lead solder. A problem with QFP technology is that there is a relatively high failure rate associated with PCBs that have been populated with QFP modules. Analysis of failed PCBs indicates that the failures generally arise via open joints between QFP modules and the PCB. A similar problem is discussed by Engelmaier and Fuentes in an article: "Component Lead and Attachment", published in Circuits Assembly, June 1995, pp. 72–75. Engelmaier et al. attribute many of the reliability problems the presence of materials having highly disparate properties. By way of example, joints made of solder have properties which are significantly different from the bonding structure materials, thereby causing thermal expansion mismatches. The severity of the thermal expansion mismatches is highly dependent on the selection of design parameters of the assembly and of the particular application. Whereas certain solutions have been advanced, e.g., geometric changes of the leads, changes in the lead surface preparation process and changes in the solder-plating process, even when used in combination, have not been successful in substantially reducing the overall problem. It is by switching over to copper alloy lead frames coupled to design modifications of the assembly and of the fixtures that the most promising results have been provided.

In another article: "Wetting behavior between solder and electroless nickel deposits", published in Materials Chemistry and Physics, 38, 1994, pp. 33–41, Lin and Jang discuss the behavior of contact angles between electroless nickel deposits and solder under vacuum at temperatures above 473K. The contact angles of solders on the aforementioned deposits were observed to decrease with increasing temperatures and test times. Higher temperatures were found to accelerate the speed of approaching equilibrium contact angles. Moreover, annealing on the electroless nickel deposits tended to enhance the wetability of the solder on the deposits, and variations in contact angle were found to found to be accompanied by the formation of intermediate compounds between the solder and the nickel deposits.

OBJECTS AND SUMMARY OF THE INVENTION

In accordance with the present invention, there is now provided a method for increasing the strength of a solder joint between a nickel-iron lead frame of an electronic circuit module and a copper pad of a printed circuit board on which the module is mounted, the method including the step of baking the joint between one and twenty hours at a temperature in the range 373K to 456K.

Viewing the present invention from a second aspect, there is now provided a method of producing an electronic circuit assembly including at least one electronic component having a nickel-iron lead frame and a printed circuit board having copper pads corresponding to leads of the lead frame, the method including depositing solder on the copper pads, placing the leads of the component in contact with the solder on the copper pads, reflowing the solder to produce a solder joint between each pad and the corresponding lead, and baking the joint between one and twenty hours at a temperature in the range 373K to 456K.

The present invention provides a solution to the problem of joint failure between a QFP or similar module and a PCB by thermal treatment of the populated PCB. Specifically, the inventors have found that solder joint strength is considerably increased by baking the populated PCB in a thermally controlled environmentally controllable environment for a predetermined period of time.

BRIEF DESCRIPTION OF THE DRAWINGS

A preferred embodiment of the present invention will now be described with reference to the accompanying drawings, in which.

DETAILED DESCRIPTION OF THE INVENTION

Figure 1:
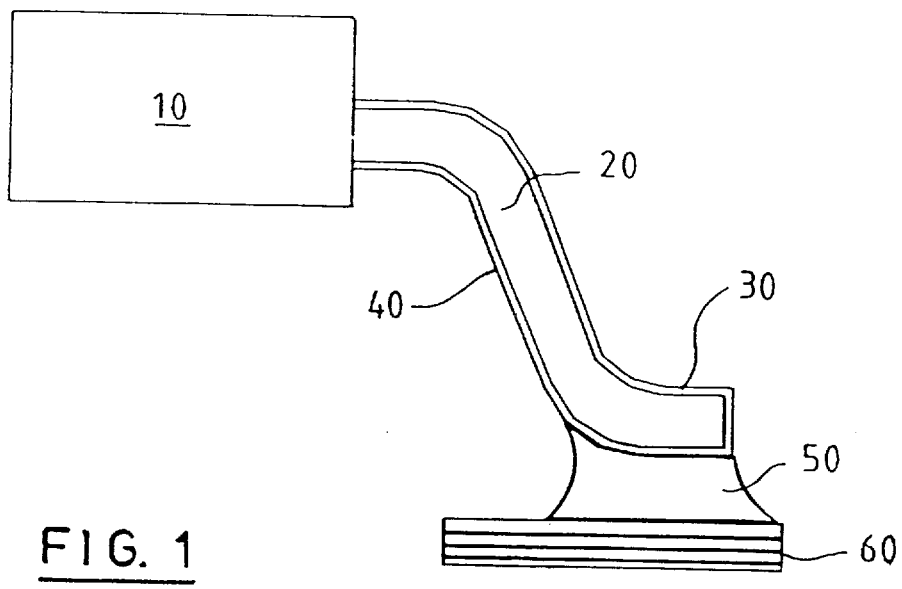
FIG. 1 is a cross sectional view of a lead of a prior art QFP module.

Referring first to FIG. 1, a typical QFP module comprises a component package 10 containing an integrated circuit. The circuit is connected within the package to a lead frame (not shown). Leads 40 of lead frame extend outside the package for electrically connect the module, and more particularly the circuit contained therein, to a PCB. Each lead 40 comprises an iron-nickel base material 20 covered by a Tin/Lead solder coat. A solder fillet 50 bonds the lead 40 to a copper pad 60 on a PCB.

Figure 2:
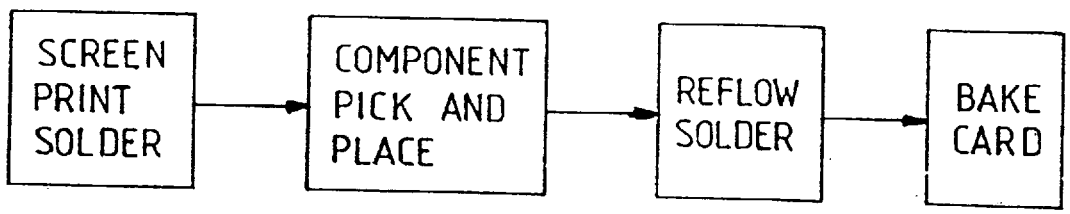
FIG. 2 is a block diagram of PCB populating apparatus in accordance with the present invention.

Referring now to FIG. 2, in an example of a manufacturing method of the present invention, solder paste is initially, at step 100, screen-printed onto copper component attachment pads or lands of a PCB. QFP surface mount electronic components having nickel-iron lead frames are then placed on the corresponding pads of the PCB at step 110. The populated PCB is then placed, at step 120, in a furnace operating at or above 456K to reflow the paste and thereby to produce a solder joint between each lead of each QFP module and the corresponding pad. The populated PCB is allowed to cool to permit the solder joints to set.

In preferred examples of the present invention, to strengthen the solder joints between the modules and the PCB, the populated PCB is now baked, at step 130, in a controllable temperature chamber at 373K for two hours.

Figure 3:
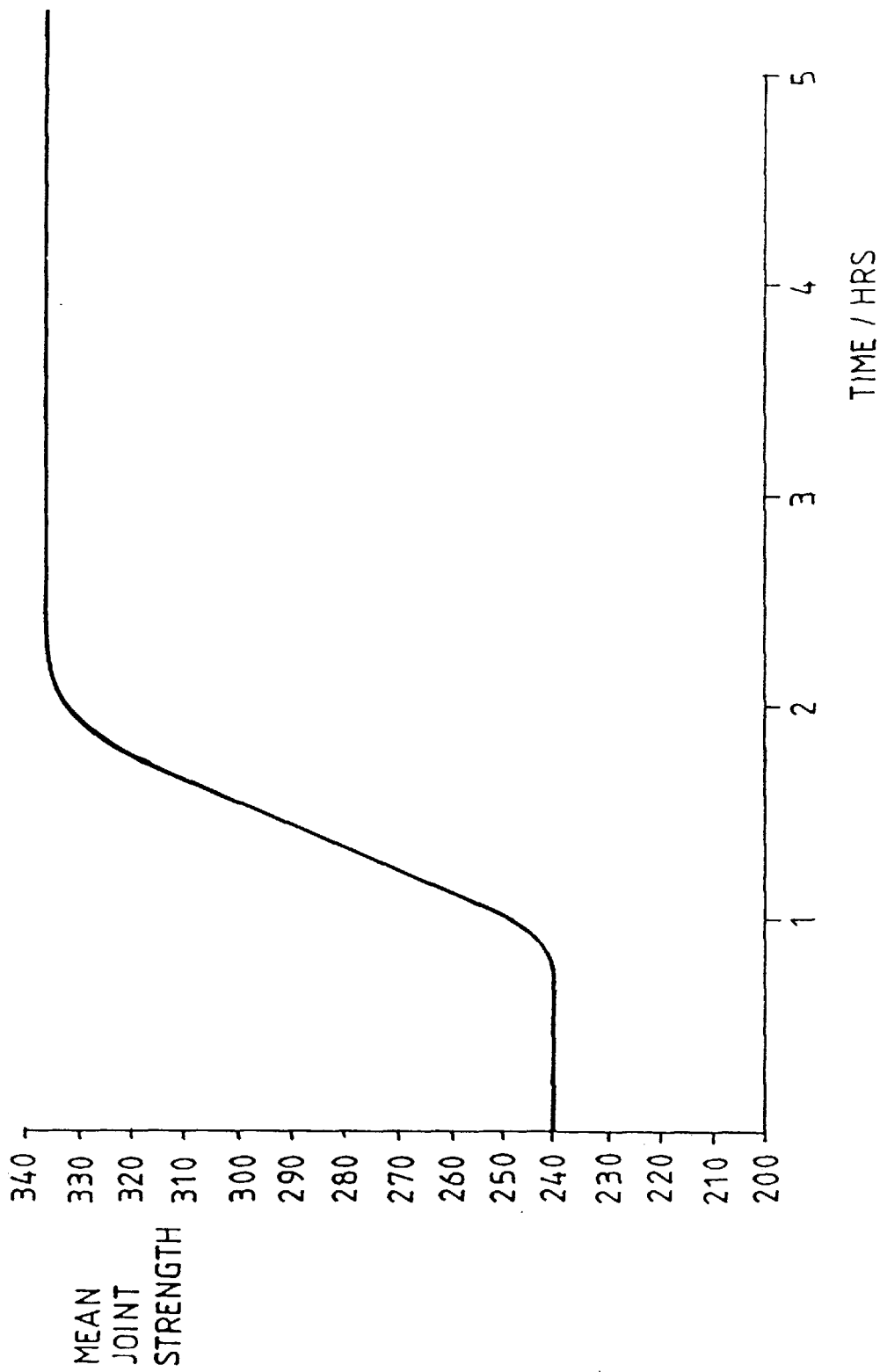
FIG. 3 is a graph of solder joint strength in relation to time for a 16 mil QFP lead soldered to a copper pad.

Referring now to FIG. 3, it will be appreciated that the 373K two hour bake produces a thirty-five per cent increase in joint strength. After two hours, there is no appreciable further increase in joint strength. Indeed, tests indicate that there is no appreciable further increase in joint strength after 20 hours. It will also be appreciated from FIG. 3, that the solder joint strength does not increase significantly prior to one hour of baking time. The solder joint strength increases in the period between one hour and two hours baking time.

In the preferred embodiment of the present invention hereinbefore described, the populated PCB is baked for two hours at 373K. However, it will be appreciated that, in other embodiments of the present invention, the populated PCB may be baked at a higher or lower temperature for less than or greater than two hours respectively, provided that the baking temperature is kept below 456K to prevent the solder from reflowing.

What is claimed is:

1. A method of producing an electronic circuit assembly comprising at least one electronic component having a nickel-iron lead frame and a printed circuit board having copper pads corresponding to leads of the lead frame, the method comprising the step of:

depositing solder on the copper pads;

placing the leads of the component in contact with the solder on the copper pads; and reflowing the solder to produce a solder joint between each pad and the corresponding lead, and baking the joint between one and twenty hours at a temperature in the range 373K to 456K.

2. A method for increasing the strength of a solder joint between a nickel-iron lead frame of an electronic circuit module and a copper pad of a printed circuit board on which the module is mounted, the method comprising the step of baking the joint between one and twenty hours at a temperature in the range 373K to 456K.

3. A method as claimed in claim 2, comprising baking the joint about two hours at a temperature in the range 373K to 456K.

* * * * *